(12) United States Patent
Lauffer et al.

(10) Patent No.: US 6,201,194 B1
(45) Date of Patent: Mar. 13, 2001

(54) MULTI-VOLTAGE PLANE, MULTI-SIGNAL PLANE CIRCUIT CARD WITH PHOTOIMAGEABLE DIELECTRIC

(75) Inventors: John M. Lauffer, Waverly; Roy H. Magnuson, Endicott; Voya R. Markovich, Endwell; John A. Welsh, Vestal, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/203,978

(22) Filed: Dec. 2, 1998

(51) Int. Cl.⁷ ...................................................... H01R 9/09
(52) U.S. Cl. ........................ 174/264; 174/255; 430/313; 29/852
(58) Field of Search ..................................... 174/262, 263, 174/264, 266, 255; 361/780, 794, 795, 793, 792; 29/852, 846, 830, 825; 428/199, 212; 427/97; 430/313, 316

(56) References Cited

U.S. PATENT DOCUMENTS

| | | | |
|---|---|---|---|
| 4,150,421 | * 4/1979 | Nishihara et al. | 361/778 |
| 4,211,603 | * 7/1980 | Reed | 156/659.1 |
| 4,729,061 | * 3/1988 | Brown | 361/719 |
| 4,795,693 | * 1/1989 | Ors et al. | 430/312 |
| 4,830,704 | 5/1989 | Voss et al. . | |
| 4,849,284 | * 7/1989 | Arthur et al. | 428/325 |
| 5,021,821 | 6/1991 | Suzuki . | |
| 5,026,624 | 6/1991 | Day et al. . | |
| 5,146,674 | 9/1992 | Frankeny et al. . | |
| 5,262,280 | 11/1993 | Knudsen et al. . | |
| 5,263,243 | * 11/1993 | Taneda et al. | 29/830 |
| 5,298,117 | 3/1994 | Hanson et al. . | |
| 5,300,402 | 4/1994 | Card, Jr. et al. . | |
| 5,334,487 | 8/1994 | Kindl et al. . | |
| 5,366,846 | 11/1994 | Knudsen et al. . | |
| 5,387,493 | 2/1995 | Imabayashi et al. | 430/280 |
| 5,451,721 | * 9/1995 | Tsukada et al. | 174/261 |
| 5,473,120 | * 12/1995 | Ho et al. | 174/264 |
| 5,883,335 | * 3/1999 | Mizumoto et al. | 174/266 |
| 6,027,858 | * 2/2000 | Jones et al. | 430/311 |

FOREIGN PATENT DOCUMENTS

| | | |
|---|---|---|
| 3-138653 | 6/1991 | (JP) . |
| 08-018234 | 1/1996 | (JP) . |

* cited by examiner

*Primary Examiner*—Jeffrey Gaffin
*Assistant Examiner*—Kamand Cuneo
(74) *Attorney, Agent, or Firm*—William N. Hogg

(57) ABSTRACT

A technique for forming an organic chip carrier or circuit board, having two voltage planes and at least two signal planes is provided which includes bonding a first layer of photolithographic dielectric material to a first metal layer and exposing the first layer of dielectric material to a pattern of radiation to provide at least one opening through the first layer of the dielectric material. A second metal layer is bonded to the first layer of photoimageable material on the opposite side from the first metal layer. Holes are etched in the first and second metal layers which correspond to and are larger than each of the patterns on said openings in the first layer of dielectric material. The exposed pattern on the first layer of dielectric material is then developed, with the openings in the first and second metal layers being larger than the corresponding developed opening in the first dielectric material. Second and third layers of photoimageable dielectric material are applied on the first and second metal layers, respectively and are photopatterned and developed to provide openings in each of the second and third layers of dielectric material some of which correspond to each of the holes in the first layer of dielectric material and the holes in the first and second metal layers, some of which terminate at the underlying metal layer. The exposed surfaces of both the second and third dielectric material, are circuitized and the holes plated or filled with metal.

13 Claims, 4 Drawing Sheets

MULTI-VOLTAGE PLANE, MULTI-SIGNAL PLANE CIRCUIT CARD WITH PHOTOIMAGEABLE DIELECTRIC

FIELD OF THE INVENTION

This invention relates generally to the production of chip carriers or printed circuit boards having multiple voltage planes, and more particularly to chip carriers, especially organic chip carriers, having multiple voltage planes separated by a dielectric material with plated through holes extending from one surface to the other through both of the voltage planes and through the dielectric material separating the voltage planes.

BACKGROUND INFORMATION

In the past, one typical technique for forming chip carriers having multiple voltage planes, i.e., at least two voltage planes, and multiple signal planes, i.e., at least two signal planes (2s/2p) using organic dielectric material has relied on mechanically drilling holes in the voltage planes and particularly mechanically drilling holes in the voltage planes after they have been laminated to a substrate such as FR4 material, which is a glass reinforced epoxy resin. This drilling has several drawbacks. First, drilling is extremely costly in that individual holes must be drilled successively and precisely on a grid. Second, the minimum hole diameter is limited, typically the minimum being from 0.006 inches to 0.008 inches, which results in a minimum land diameter of 0.010 to 0.014 inches, particularly in subtractive processing. Moreover, drilling can lead to reliability problems caused by cathodic and anodic filament plating growth along the glass fibers, which may be damaged by the drilling, and this causes either failure or out of specification parts. Additionally, power distribution in a typically drilled organic chip carrier is poor due to the large amount of copper that must be etched away to provide clearance or tolerance for the plated through holes due to the relatively large grid size required.

All of these factors result in a minimum I/O grid of 0.018 inches to 0.02 inches. As the technology advances, a desirable I/O grid is of 0.010 inches to accommodate flip chip attachment (i.e., solder ball or C4 joints).

SUMMARY OF THE INVENTION

According to the present invention, a technique for forming a chip carrier, and preferably an organic chip carrier, having two voltage planes and at least two signal planes is provided. The technique includes bonding a first layer of photolithographic dielectric material to a first metal layer and exposing the first layer of dielectric material to a pattern of radiation to provide at least one opening through the first layer of the dielectric material to be developed in subsequent processing.

A second metal layer is bonded to the first layer of photoimageable material on the opposite side from the first metal layer. Holes are etched in the first and second metal layers which correspond to and are larger than each of the patterns on said openings in the first layer of dielectric material. The exposed pattern on the first layer of dielectric material is then developed to form at least one opening corresponding to the exposed pattern through the first and second metal layers and through the first layer of dielectric material, with the openings in the first and second metal layers being larger than the developed opening in the first dielectric material.

Second and third layers of photoimageable dielectric material are applied on the first and second metal layers, respectively. The second and third layers of photopatternable dielectric material are photopatterned and developed to provide openings in each of the second and third layers of dielectric material corresponding to each of the holes in the first layer of dielectric material and the holes in the first and second metal layers. The exposed surfaces of at least the second dielectric material, and preferably both the second and third dielectric material, are circuitized and the holes plated such that there is circuitry on at least one side, and preferably both sides, and one plated through hole that extends all the way through the dielectric material. The circuitization may be carried out with an additive process sequence, a full subtractive process sequence, or a semiadditive pattern plate process sequence. Preferably, the layers of metal and the circuitry are formed of copper, and preferably the etching of the holes in the layers of copper is performed utilizing photolithographic techniques. The circuitization also preferably is by photolithographic process.

DESCRIPTION OF THE PREFERRED EMBODIMENT

Figure 1:
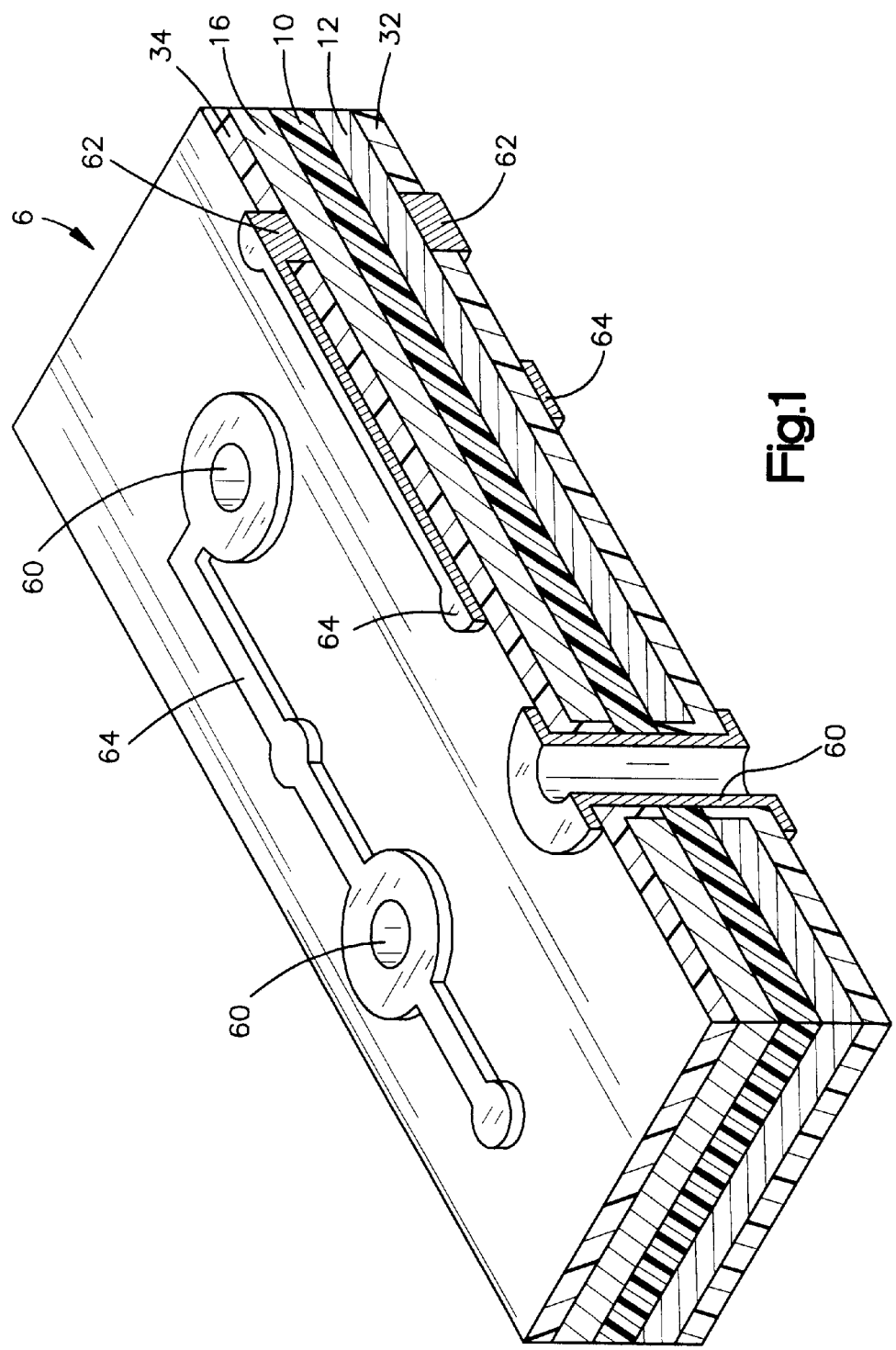
FIG. 1 is a perspective view, partially in section, depicting a chip carrier formed according to the present invention.

Referring now to the drawings and for the present to FIG. 1, a perspective view, partially in section and somewhat schematic, of a chip carrier 6 formed according to the present invention is shown. The structure depicted is a 2S/2P structure, i.e., there are two voltage planes and two signal planes. As used herein, the term "voltage plane" includes a plane at ground potential as well as planes having applied voltage. Indeed, in the present invention, the two voltage planes include a ground plane, as well as a plane having positive or negative voltage.

Figure 2A:
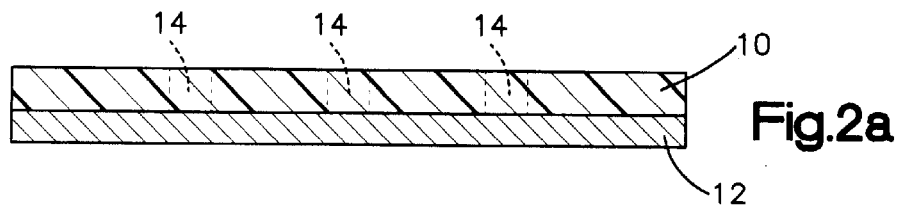
FIGS. 2a–2m are longitudinal sectional views showing in stepwise sequence the formation of the carrier of FIG. 1.

The technique and method of forming the chip carrier 6 is depicted in FIGS. 2a–2m. Referring now to FIG. 2a, a layer of photopatternable dielectric material 10 is shown which is applied to one surface of a metal layer 12, preferably copper. The dielectric material is preferably an epoxy-based resin of the type described in commonly-assigned U.S. Pat. No. 5,026,624, which can be curtain coated as described therein or can contain a thixotrope and be applied by flood screening as described in commonly-assigned U.S. Pat. No. 5,300,402. Additionally, the photopatternable material may be formed into a dry film and laminated to the copper foil 12. A suitable technique for forming the dry film is as follows.

The photoimageable dielectric composition is prepared having a solids content of from about 86.5 to 89%, such solids comprising: about 27.44% PKHC a phenoxy resin; 41.16% of Epirez 5183 a tetrabromobisphenol A; 22.88% of Epirez SU-8, an octafunctional epoxy bisphenol A formaldehyde novolac resin, 4.85% UVE 1014 photoinitiator; 0.07% ethylviolet dye; 0.03% Fc 430 a fluorinated polyether nonionic surfactant from 3M Company; 3.85% Aerosil 380, an amorphous silicon dioxide from Degussa; to provide the solid content. Solvent was present from about 11 to 13.5% of the total photoimageable dielectric composition. The photoimageable dielectric composition is coated onto a 1.42 mil thick segment of polyethylene terephthalate designated Mylar D a segment of polyethylene terephthalate designated Mylar D a polyester layer from DuPont. The photoimageable dielectric composition is allowed to dry to provide a 2.8 mil thick photoimageable dielectric film on the polyethylene terephthalate backing.

If it is applied as a dry film, it is preferably vacuum laminated onto the surface. The thickness of each of these layers is preferably between about 0.002 inches and 0.005 inches. If it is dry coated, any surface protecting material, such as Mylar®, is removed.

The particular technique of applying the dielectric material is not critical to the invention, but rather is selected by engineering practices in forming the carriers.

The metal layer 12, which preferably is copper and preferably is either ½ oz. or 1 oz. copper, will form one of the voltage planes. Generally, the copper layer should be between about 0.5 and about 2.8 mils thick depending upon the voltage plane requirements of the product.

The photopatternable material 10 is a negative acting photo material, i.e., one that develops where it is not exposed and will harden or partially cure upon application of heat where exposed. The material 10 is then exposed to radiation with masks over those areas 14 where holes are to be formed. It is preferred in the manufacture that the exposed areas, i.e., the areas of layer 10 outside of layer 14, be pre-exposed rather than fully exposed, i.e., that the areas of layer 10 outside of layer 14 be exposed to a lesser degree of radiation than normally would be necessary to fully expose it. Preferably, this exposure is to UV light in the range of about 100 to about 800 milijoules for a period of about 0.5 to about 2.0 minutes. This is a pre or partial exposure, as opposed to full exposure, so that the surface thereof will remain sufficiently tacky to allow another sheet of copper to be laminated thereto in a subsequent operation.

Figure 2B:
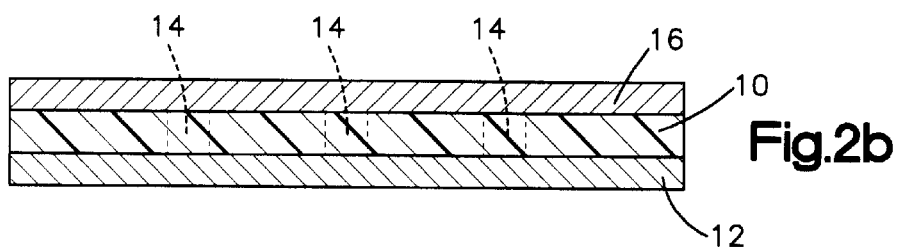

Following this pre- or partial exposure, a second layer of copper 16 is laminated to the opposite side of the dielectric 10 from that on which the layer of copper 12 is laminated. Again, it is preferred that this layer preferably be a ½ oz. to 1 oz. copper foil, the range of thickness being the same as the first layer 12 of copper. This stage of production is shown in FIG. 2b.

Figure 2C:
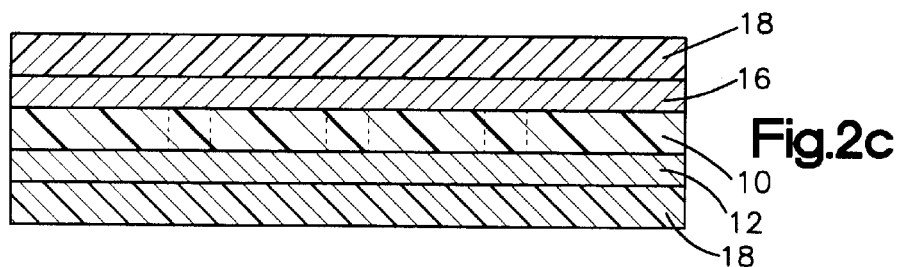
Figure 2D:
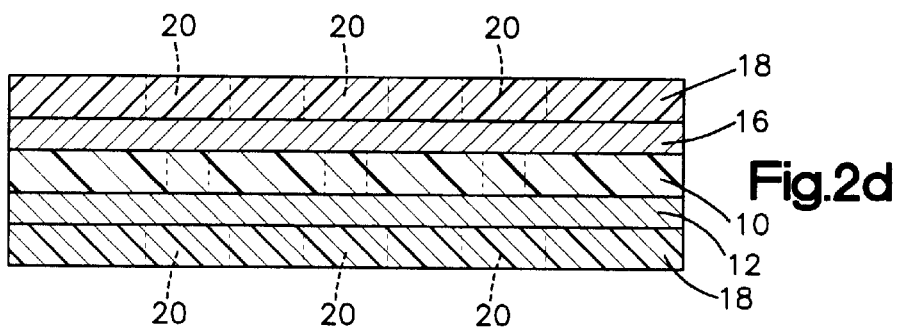

Following the lamination of the copper layer 16 to the first layer of dielectric material 10, a layer of photoresist 18 is applied over both of the layers of copper 12 and 16. Preferably, this photoresist is CFI or CF sold by McDermid Company. This is shown in FIG. 2c. The photoresist 18 on both layers of the copper 12 and 16 is patterned so that, when developed, it will have holes 20 corresponding to, but slightly larger than, the unexposed areas in the dielectric material 10. This is shown in FIG. 2d. This will allow the copper to be etched back from the edge of the hole 14 so that when the hole 14 ends up as a plated through hole, the plating will pass through the copper sheets 12 and 16 without contacting them so as to form a plated through hole which is electrically insulated from layers 12 and 16 of the copper after subsequent layers of photopatternable dielectric are added.

Figure 2E:
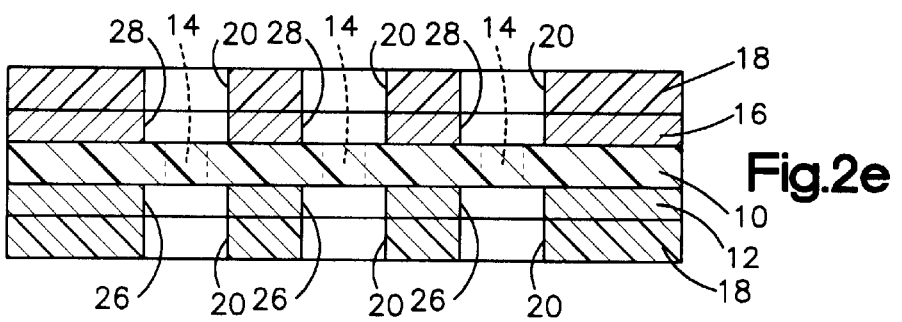
Figure 2F:
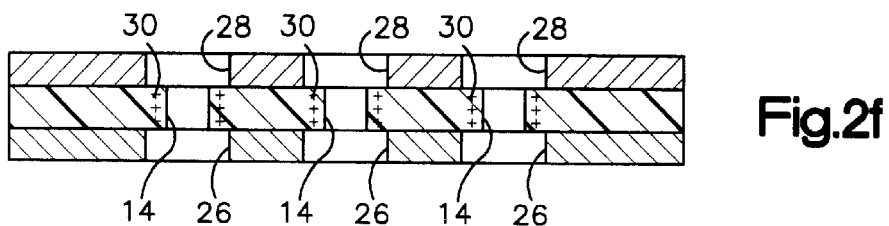

After the photoresist 18 is patterned, it is developed with a conventional developer such as sodium carbonate, after which the exposed copper 16 and 18 is etched with a conventional copper etchant, such as cupric chloride to form openings 26 and 28 in the copper sheets 12 and 16. This condition is shown in FIG. 2e. As can be seen in FIG. 2e, the unexposed portions 14 of the first layer of dielectric material 10 are contained within the openings 26 and 28 etched in the copper foil 12 and 16, respectively. The remaining photoresist 18 is then stripped using a conventional stripper, such as sodium hydroxide. Prefereably, the rings 30 of FIG. 2f are given a final exposure for about 2 minutes to ultraviolet light of about 200 to about 1500 milijoules, following which the part is post-expose baked at about 125° C. for one hour. This will suppress dielectric removal between planes of copper adjacent to the rings 30 during develop and increase the rigidity of the rings for the next steps.

The areas 14 in the dielectric material 10 are then developed, preferably using propylene carbonate, which will provide the structure shown in FIG. 2f. As can be seen in FIG. 2f, the developed holes 14 are smaller than the openings 26 and 28 in the copper, leaving the ring 30 around each developed hole 14. The structure of FIG. 2f is then thermally cured, preferably at 195–200 ° C. for 3 hours.

Figure 2G:
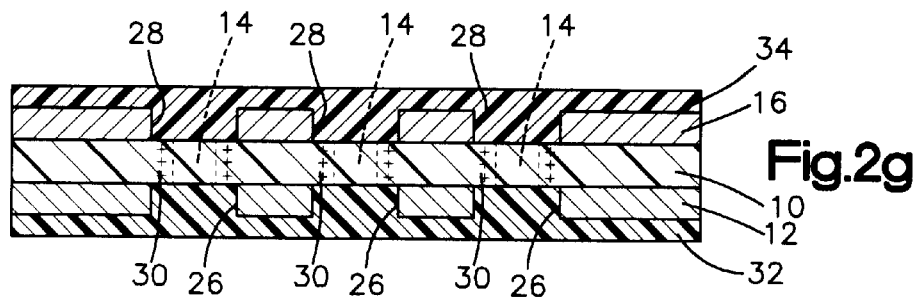
Figure 2H:
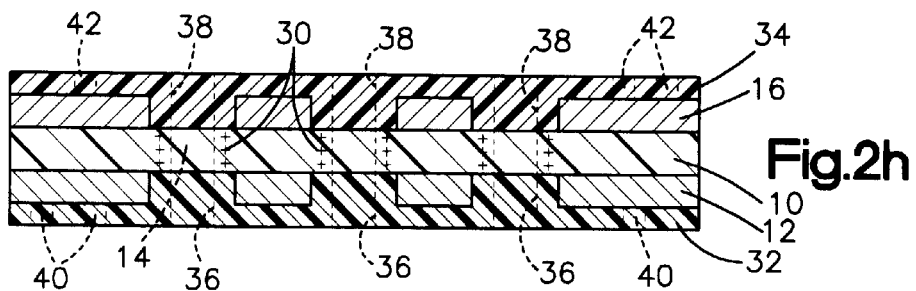

The exposed surfaces of the copper sheets 12 and 16 are then treated with a standard Shipley chlorite solution which contains sodium chlorite ($NaClO_2$) , following which a second layer 32 of photopatternable material is applied to the exposed surface of the copper sheet 12, and a third layer of photopatternable material 34 is applied to the exposed surface of the copper sheet 16 as shown in FIG. 2g. Again, this material is preferably an epoxy-based resin of the type described in U.S. Pat. No. 5,026,624, which can be either curtain coated or flood screened or applied as a dry film as described above. If it is applied as a dry film, it is preferably vacuum laminated onto the surface. The thickness of each of these layers is preferably between about 0.002 inches and 0.005 inches. If it is dry coated, any surface protecting material, such as Mylar®, is removed. The layers 32 and 34 are exposed to form areas for openings 36 in layer 32 and openings 38 in layer 34 which are aligned with the openings 14 in the layer 10. The layers 32 and 34 are also photopatterned to provide for openings 40 and 42 for the provision of blind vias to extend through the layers 32 and 34, respectively, to the underlying copper layers 12 and 16, respectively. This is shown in FIG. 2h.

The carrier in this form is then baked at 125° C. for one hour. The dielectric material in the layers 32 and 34 is then developed, again using propylene carbonate, to open up the holes to thereby provide the through holes necessary for the plated through holes and the blind vias 40 and 42 which extend down to the underlying copper layers 12 and 16, respectively. The material is then given a UV bump between 2 and 6 joules on each side, after which the parts are cured at about 150° C. to about 200° C. for one hour.

Figure 2I:
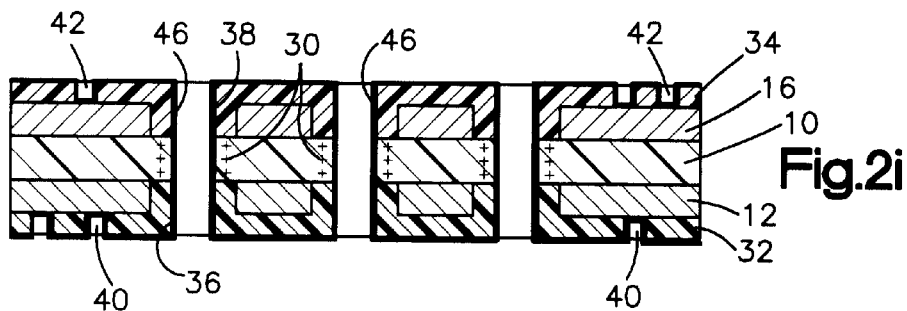

Following the cure, the exposed surfaces are surface treated, such as by a vapor blast and desmearing as is well known, after which, if the circuitization is to be by additive plating, the surfaces are treated with palladium catalyst or seed 46 as shown in FIG. 2i.

Figure 2J:
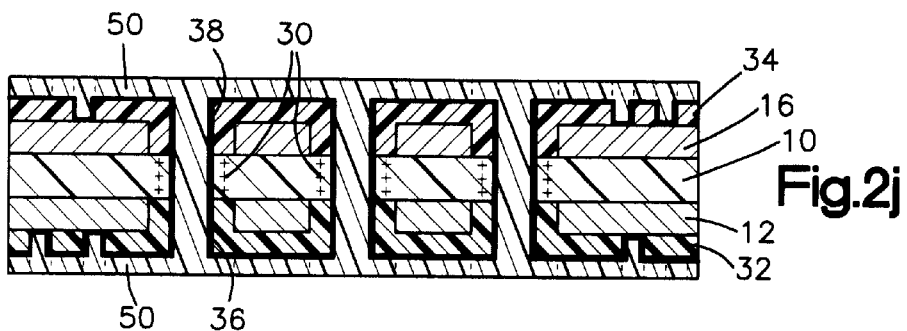
Figure 2K:
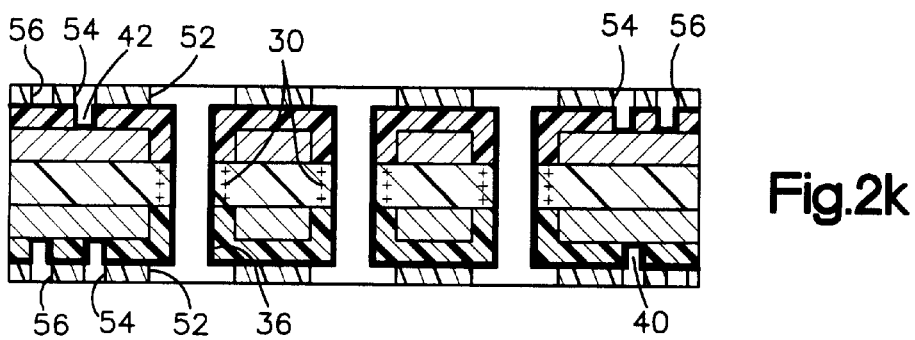

Circuitization takes place by applying a layer of photoresist 50, such as Riston T168 sold by DuPont Co., over each of the photopatternable material layers 32 and 34 as shown in FIG. 2j, and exposing and developing the photoresist 50 to provide openings 52 corresponding to the openings 14, openings 54 corresponding to the openings 42 and openings 56 for providing circuitry on the surface of the respective layer of photoimageable material 32 and 34 as shown in FIG. 2k. It will be noted that the openings 52 are slightly larger than the hole 14 and larger than the openings 36 and 38 in the photoimageable material 32 and 34, respectively. This will allow lands to be formed as a part of the plated through holes in a well known manner.

Figure 2L:
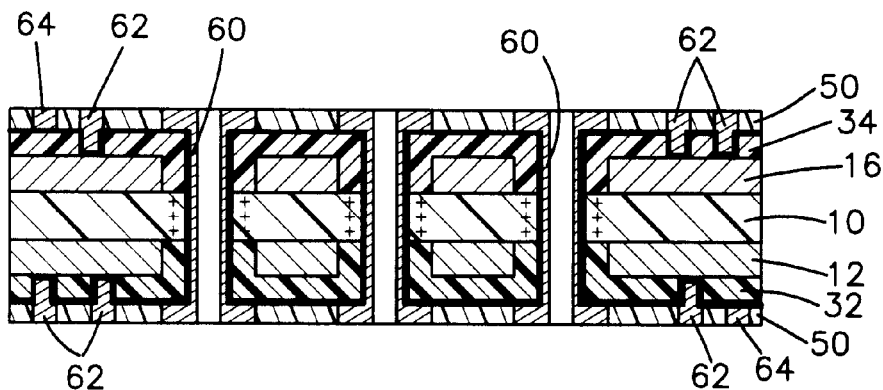

After the hole patterns with the holes 52, 54 and 56 have been developed as shown in FIG. 2k, electroless plating is performed by conventional techniques as shown in FIG. 2*l*, after which the remaining photoresist 50 is stripped, using propylene carbonate at a temperature of between about 60° C. and about 100° C., and the remaining exposed catalyst stripped in a cyanide bath.

Figure 2M:
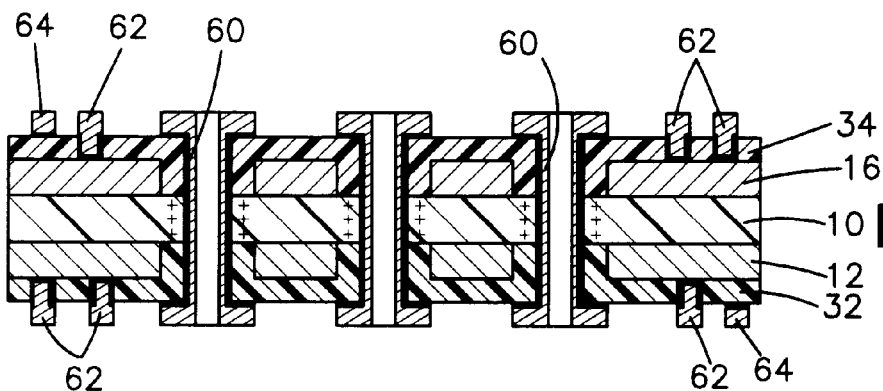
Figure 2N:
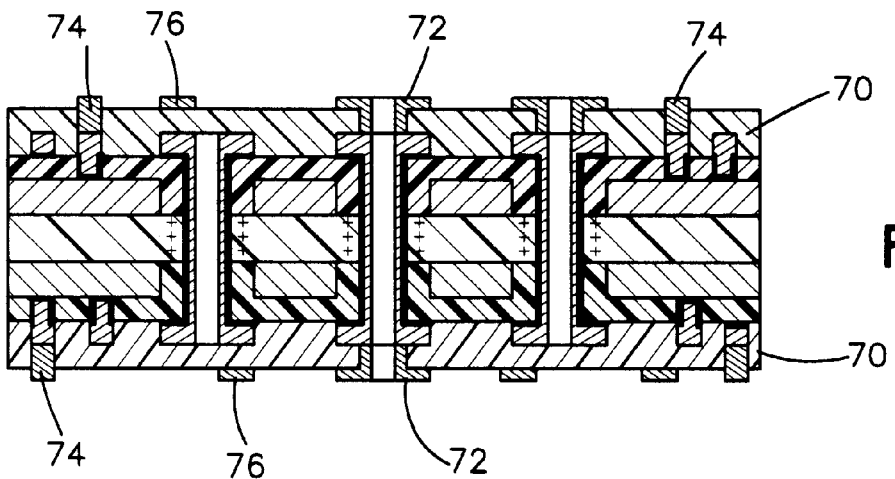
FIG. 2n is a view similar to FIG. 2m of another embodiment of the invention.

This results in circuitry as shown in FIG. 2*m* and FIG. 1, which includes plated through holes 60, blind vias 62 and circuitry 64 on top of the layers 32 and 34 of the dielectric material. Thus, a chip carrier having two voltage planes 12 and 16 and two signal planes 64 with plated through holes extending through the voltage planes 12 and 16 is provided according to this technique.

It is also possible to generate additional signal plane layers on each side by following the steps of applying photoimageable dielectric material 70 on top of the circuitry 60, 62 and 64 and following the steps of photopatterning, developing and circuitizing as previously described for the layers 32 and 34 to thereby provide plated through holes 72, blind vias 74 which will connect with blind vias 62 on the underlying circuit layer and circuitization 76. Of course, it should be understood that on these additional layers, blind vias cannot be connected directly to either the layers 12 or 16.

Accordingly, the preferred embodiment of the present invention has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A chip carrier or circuit board comprising:
   a first layer of photoimageable material sandwiched between first and second metal layers, a second layer of photoimageable material bonded to said first metal layer, and a third layer of photoimageable material bonded to said second metal layer,
   circuitry formed on both said second layer of said photoimageable material and said third layer of photoimageable material,
   plated through holes extending through all of said photoimageable materials and both of said metal layers to connect a portion of the circuitry on said second layer of photoimageable material with a portion of the circuitry on said third layer of photoimageable material,
   and metal filled vias extending from the circuitry on said second layer of photoimageable material through said second photoimageable material to said first metal layer and from the circuitry on said third layer of photoimageable material through said third photoimageable material to said second metal layer.

2. The invention as defined in claim 1 wherein said plated through holes and said vias are openings formed by photo-imaging.

3. The invention as defined in claim 1 wherein a fourth layer of photoimageable material is disposed on said second layer of photoimageable material and a fifth layer of photoimageable material is disposed on said third layer of photoimageable material, and circuitry is dispersed on both said fourth layer of photoimageable material and fifth layer of photoimageable material, and metal filled holes connect the circuitry on said fourth layer of photoimageable material and said fifth layer of photoimageable material to the plated through holes.

4. A method of forming a chip carrier or circuit board having two voltage planes and at least two signal planes comprising the steps of;
   bonding a first layer of photoimageable dielectric material to a first metal layer;
   exposing said first layer of photoimageable dielectric material to a pattern of radiation to provide at least one opening through said first layer of photoimageable dielectric material;
   bonding a second metal layer to said first layer of photoimageable material on the opposite side from said first metal layer;
   etching holes in said first and second metal layers corresponding to and aligned with and at least as large as each of said patterns of each said opening in said first layer of said dielectric material;
   developing said pattern of said holes in said first dielectric material to thereby provide at least one opening through said first and second metal layers and said first layer of said dielectric material.
   providing second and third layers of photoimageable dielectric material on said first and second metal layers respectively;
   photopatterning and developing openings in each of said second and third layers of dielectric material corresponding to each of the holes in said first dielectric material and smaller than the holes in each of said first and second metal layers; and
   circuitizing the exposed surface of at least said second dielectric material, plating at least said one hole that extends through all of said dielectric material to provide circuitry on said at least one surface a plated through hole extending through all of the layers of said dielectric material and both of said metal layers.

5. The invention as defined in claim 4, further characterized by forming blind metal vias having metal therein from said at least one surface of said second dielectric material to said first metal layer.

6. The invention as defined in claim 4, further characterized by forming circuitry on the exposed surface of said third layer of said dielectric material.

7. The invention as defined in claim 4 wherein said photoimageable material is an epoxy-based resin.

8. The invention as defined in claim 4 wherein said exposed surface of said second layer of dielectric material and said plated through holes are formed by photolithographic plating techniques.

9. The invention as defined in claim 8 wherein said photolithographic techniques include additive plating.

10. The invention as defined in claim 4 wherein said holes in said first and second layers of metal are formed by photolithographic techniques.

11. The invention as defined in claim 4 wherein each of said metal layers are formed of copper.

12. The invention as defined in claim 5 further characterized by providing at least a fourth layer of photoimagable material on said second layer of photoimagable material,
   photopatterning and developing openings in said fourth layer of dielectric material corresponding to openings in said second layer of photopatternable material,
   forming circuitry on the exposed surface of said fourth dielectric material, and plating at least one opening in said fourth photoimageable material to provide circuitry on said exposed surface of said fourth photoimageable material and connection of said circuitry on said fourth layer of photoimageable material to the circuitry on said second layer of photoimageable material.

13. The invention as defined in claim 4 wherein the second layer of dielectric material and through holes are plated completely with copper and the circuit pattern is formed by photoresist and substractive etching.

* * * * *